US008564006B2

(12) United States Patent
Tachibana et al.

(10) Patent No.: US 8,564,006 B2
(45) Date of Patent: Oct. 22, 2013

(54) NITRIDE SEMICONDUCTOR DEVICE AND NITRIDE SEMICONDUCTOR LAYER GROWTH SUBSTRATE

(75) Inventors: Koichi Tachibana, Kanagawa-ken (JP); Hisashi Yoshida, Kanagawa-ken (JP); Hiroshi Ono, Tokyo (JP); Hajime Nago, Kanagawa-ken (JP); Yoshiyuki Harada, Tokyo (JP); Toshiki Hikosaka, Kanagawa-ken (JP); Maki Sugai, Kanagawa-ken (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 13/405,985

(22) Filed: Feb. 27, 2012

(65) Prior Publication Data
US 2012/0299015 A1    Nov. 29, 2012

(30) Foreign Application Priority Data

May 27, 2011   (JP) ................. 2011-119037

(51) Int. Cl.
*H01L 33/00* (2010.01)
(52) U.S. Cl.
USPC ......... 257/98; 257/E33.001; 257/99; 257/100
(58) Field of Classification Search
USPC .................. 257/98–100, E33.001
See application file for complete search history.

(56) References Cited

U.S. PATENT DOCUMENTS

| 7,781,790 | B2 * | 8/2010 | Minato et al. .......... 257/98 |
| 8,247,822 | B2 * | 8/2012 | Cheng et al. .......... 257/79 |
| 2010/0096657 | A1 * | 4/2010 | Ou et al. .............. 257/98 |
| 2011/0095327 | A1 * | 4/2011 | Shinohara et al. ...... 257/98 |
| 2011/0121334 | A1 * | 5/2011 | Dai et al. ............ 257/98 |
| 2011/0140153 | A1 * | 6/2011 | Lee .................. 257/98 |

FOREIGN PATENT DOCUMENTS

JP    4055503    3/2008

OTHER PUBLICATIONS

U.S. Appl. No. 13/219,011, filed Aug. 26, 2011, Ono, et al.

* cited by examiner

*Primary Examiner* — Matthew W Such
*Assistant Examiner* — Ali Naraghi
(74) *Attorney, Agent, or Firm* — Oblon, Spivak, McClelland, Maier & Neustadt, L.L.P.

(57) ABSTRACT

According to one embodiment, a nitride semiconductor device includes a substrate and a semiconductor functional layer. The substrate is a single crystal. The semiconductor functional layer is provided on a major surface of the substrate and includes a nitride semiconductor. The substrate includes a plurality of structural bodies disposed in the major surface. Each of the plurality of structural bodies is a protrusion provided on the major surface or a recess provided on the major surface. An absolute value of an angle between a nearest direction of an arrangement of the plurality of structural bodies and a nearest direction of a crystal lattice of the substrate in a plane parallel to the major surface is not less than 1 degree and not more than 10 degrees.

20 Claims, 10 Drawing Sheets

NITRIDE SEMICONDUCTOR DEVICE AND NITRIDE SEMICONDUCTOR LAYER GROWTH SUBSTRATE

CROSS-REFERENCE TO RELATED APPLICATIONS

This application is based upon and claims the benefit of priority from the prior Japanese Patent Application No. 2011-119037, filed on May 27, 2011; the entire contents of which are incorporated herein by reference.

FIELD

Embodiments described herein relate generally to a nitride semiconductor device and a nitride semiconductor layer growth substrate.

BACKGROUND

For example, semiconductor light emitting devices using nitride semiconductors of gallium nitride (GaN) and the like have been applied to ultraviolet, violet, blue, and green light emitting diodes (LEDs), bluish-violet and blue laser diodes (LDs), and the like.

In a semiconductor light emitting device, it is desirable to improve the crystallinity and increase the luminous efficiency.

In an LED, for example, although a semiconductor thin film structure made of GaN is stacked mainly on a sapphire substrate, the light produced by the semiconductor layer tends to be trapped easily in the GaN semiconductor layer because the refractive index differs greatly between the GaN semiconductor and the sapphire. Conversely, there is a method in which an unevenness is provided in the surface of the sapphire substrate to increase the light extraction efficiency. However, even when such a structure is used, there is room for improvement to increase the efficiency.

DETAILED DESCRIPTION

Figure 1A:
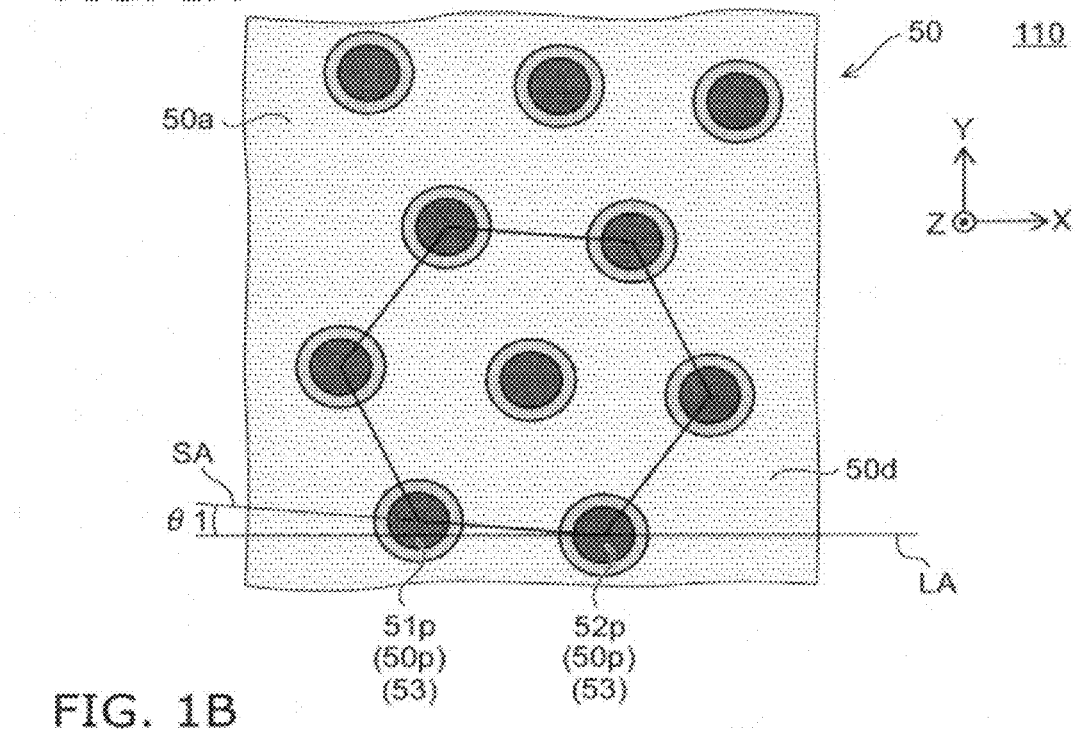
FIG. 1A and FIG. 1B are schematic views illustrating a nitride semiconductor device according to a first embodiment.

According to one embodiment, a nitride semiconductor device includes a substrate and a semiconductor functional layer. The substrate is a single crystal. The substrate has a major surface and includes a plurality of structural bodies disposed in the major surface. Each of the plurality of structural bodies is a protrusion provided on the major surface or a recess provided on the major surface. An absolute value of an angle between a nearest direction of an arrangement of the plurality of structural bodies and a nearest direction of a crystal lattice of the substrate in a plane parallel to the major surface is not less than 1 degree and not more than 10. The semiconductor functional layer is provided on the major surface and includes a nitride semiconductor.

According to another embodiment, a nitride semiconductor device includes a substrate and a semiconductor functional layer. The substrate is a single crystal. The semiconductor functional layer is provided on a major surface of the substrate and includes a nitride semiconductor. The substrate includes a plurality of structural bodies disposed in the major surface. Each of the plurality of structural bodies is a protrusion provided on the major surface or a recess provided on the major surface. A planar configuration of each of the plurality of structural bodies cut by a plane parallel to the major surface has anisotropy along two mutually perpendicular axes parallel to the major surface. An absolute value of an angle between an axis direction of the anisotropy and a nearest direction of a crystal lattice of the substrate in the plane parallel to the major surface is not less than 1 degree and not more than 10 degrees.

According to another embodiment, a nitride semiconductor layer growth substrate of a single crystal includes a plurality of structural bodies disposed in a major surface used to grow a nitride semiconductor layer. Each of the plurality of structural bodies is a protrusion provided on the major surface or a recess provided on the major surface. An absolute value of an angle between a nearest direction of an arrangement of the plurality of structural bodies and a nearest direction of a crystal lattice of the nitride semiconductor layer growth substrate in a plane parallel to the major surface is not less than 1 degree and not more than 10 degrees.

According to another embodiment, a nitride semiconductor layer growth substrate of a single crystal includes a plurality of structural bodies disposed in a major surface used to grow a nitride semiconductor layer. Each of the plurality of structural bodies is a protrusion provided on the major surface or a recess provided on the major surface. A planar configuration of each of the plurality of structural bodies cut by a plane parallel to the major surface has anisotropy along two mutually perpendicular axes parallel to the major surface. An absolute value of an angle between an axis direction of the anisotropy and a nearest direction of a crystal lattice of the nitride semiconductor layer growth substrate in the plane parallel to the major surface is not less than 1 degree and not more than 10 degrees.

Various embodiments will be described hereinafter with reference to the accompanying drawings.

The drawings are schematic or conceptual; and the relationships between the thicknesses and the widths of portions, the proportions of sizes among portions, and the like are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

The embodiment relates to a nitride semiconductor device. The nitride semiconductor device according to the embodiment includes light receiving devices as well as semiconductor light emitting devices such as LEDs, LDs and the like. The nitride semiconductor device according to the embodiment further includes switching devices using GaN such as HEMTs and the like. An LED will now be described as one example of the nitride semiconductor device according to the embodiment.

Figure 1B:
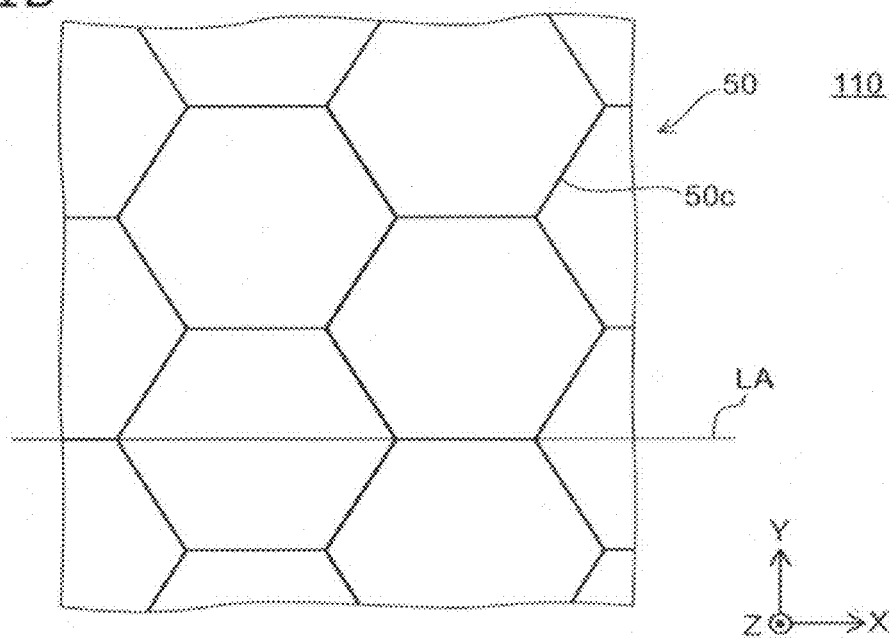

FIG. 1A and FIG. 1B are schematic views illustrating the configuration of the nitride semiconductor device according to the first embodiment.

Figure 2:
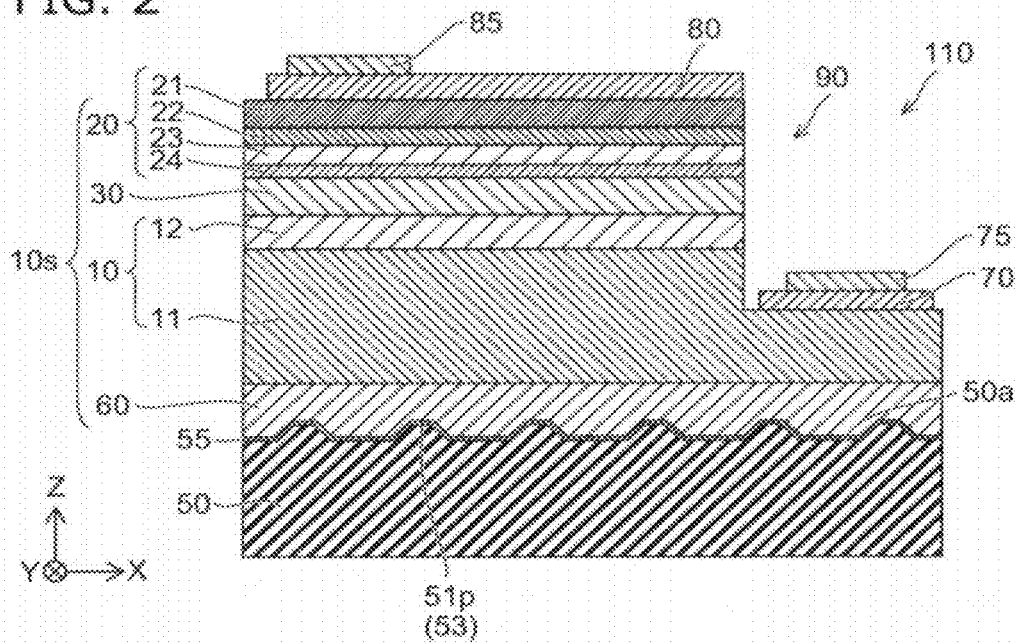
FIG. 2 is a schematic cross-sectional view illustrating an overview of the nitride semiconductor device according to the first embodiment.

FIG. 2 is a schematic cross-sectional view illustrating an overview of the configuration of the nitride semiconductor device according to the first embodiment.

First, the overview of the configuration of the nitride semiconductor device according to the embodiment will be described using FIG. 2.

As illustrated in FIG. 2, the nitride semiconductor device 110 according to the embodiment includes a substrate 50 and a semiconductor functional layer 90. The substrate 50 is a single crystal. Specifically, the substrate 50 may include, for example, a monocrystalline substrate of sapphire. The substrate 50 may include, for example, GaN, SiC, and the like. The semiconductor functional layer 90 is provided on a major surface 50a of the substrate 50. The semiconductor functional layer 90 includes a nitride semiconductor.

The substrate 50 includes multiple structural bodies 53.

The multiple structural bodies 53 are provided on the major surface 50a of the substrate 50. The multiple structural bodies 53 are arranged in the major surface 50a of the substrate 50. For example, the multiple structural bodies 53 are arranged two-dimensionally in the major surface 50a of the substrate 50. Each of the multiple structural bodies 53 is a protrusion 50p provided on the major surface 50a or a recess provided on the major surface 50a.

For example, a continuous recess and multiple protrusions 50p are provided on the major surface 50a of the substrate 50. A continuous protrusion and multiple recesses may be provided on the major surface 50a of the substrate 50. The case where the continuous recess and the multiple protrusions 50p are provided, that is, the case where the structural body 53 is the protrusion 50p, will now be described.

In this example, the semiconductor functional layer 90 includes a first semiconductor layer 10, a light emitting layer 30, and a second semiconductor layer 20.

The first semiconductor layer 10 is provided on the major surface 50a of the substrate 50. The first semiconductor layer 10 includes a nitride semiconductor and has a first conductivity type. The light emitting layer 30 is provided on the first semiconductor layer 10 and includes a nitride semiconductor. The second semiconductor layer 20 is provided on the light emitting layer 30. The second semiconductor layer 20 includes a nitride semiconductor and has a second conductivity type. The second conductivity type is different from the first conductivity type.

For example, the first conductivity type is an n type; and the second conductivity type is a p-type. However, the embodiment is not limited thereto. The first conductivity type may be the p-type; and the second conductivity type may be the n-type. The case will now be described where the first conductivity type is the n type and the second conductivity type is the p-type.

Herein, a direction from the substrate 50 toward the semiconductor functional layer 90 is taken as a Z-axis direction. One axis perpendicular to the Z-axis is taken as an X-axis. A direction perpendicular to the Z-axis and the X-axis is taken as a Y-axis. The Z-axis is perpendicular to the major surface 50a of the substrate 50. The Z-axis is parallel to a stacking direction of a stacked structural body 10s that includes the first semiconductor layer 10, the light emitting layer 30, and the second semiconductor layer 20.

In the specification of the application, stacking includes not only the case of being overlaid in direct contact but also the case of being overlaid with another component inserted therebetween.

The first semiconductor layer 10 includes, for example, a first n-side layer 11 and a second n-side layer 12. The light emitting layer 30 is provided between the first n-side layer 11 and the second semiconductor layer 20. The second n-side layer 12 is provided between the first n-side layer 11 and the light emitting layer 30. The first n-side layer 11 functions as, for example, an n-side contact layer. The first n-side layer 11 may include, for example, an n-type GaN layer. The second n-side layer 12 may function as an n-side guide layer. The second n-side layer 12 may include, for example, an n-type GaN layer.

In this example, the second semiconductor layer 20 includes a first p-side layer 21, a second p-side layer 22, a third p-side layer 23, and a fourth p-side layer 24. The light emitting layer 30 is provided between the first p-side layer 21 and the first semiconductor layer 10. The second p-side layer 22 is provided between the first p-side layer 21 and the light emitting layer 30. The third p-side layer 23 is provided between the second p-side layer 22 and the light emitting layer 30. The fourth p-side layer 24 is provided between the third p-side layer 23 and the light emitting layer 30.

The first p-side layer 21 functions as, for example, a p-side contact layer. The first p-side layer 21 may include, for example, a p-type GaN layer. The second p-side layer 22 may function as a p-side guide layer. The second p-side layer 22 may include, for example, a p-type GaN layer. The third p-side layer 23 may function as, for example, an electron overflow prevention layer (a suppression layer). The third p-side layer 23 may include, for example, a p-type AlGaN layer. The fourth p-side layer 24 may function as another guide layer on the p-side. The fourth p-side layer 24 may include, for example, a p-type GaN layer.

As illustrated in FIG. 2, the semiconductor functional layer 90 (the stacked structural body 10s) may further include a foundation layer 60. The foundation layer 60 is provided between the substrate 50 and the first semiconductor layer 10. In other words, the first semiconductor layer 10 is disposed between the foundation layer 60 and the light emitting layer 30. The foundation layer 60 may include, for example, a GaN layer.

In this example, the nitride semiconductor device 110 further includes a buffer layer 55. The buffer layer 55 is provided between the substrate 50 and the foundation layer 60. The buffer layer 55 may include, for example, a GaN layer.

The nitride semiconductor device 110 further includes a first electrode 70 and a second electrode 80.

The first electrode 70 is electrically connected to the first semiconductor layer 10. The second electrode 80 is electrically connected to the second semiconductor layer 20.

In this example, the light emitting layer 30 is provided between the second semiconductor layer 20 and a portion of the first semiconductor layer 10. On the major surface of the stacked structural body 10s on the second semiconductor layer 20 side, the first electrode 70 is provided on the portion of the first semiconductor layer 10, and the second electrode 80 is provided on the second semiconductor layer 20.

The nitride semiconductor device 110 further includes a first electrode pad 75 and a second electrode pad 85.

The first electrode pad 75 is provided, for example, on the first electrode 70 (on the side of the first electrode 70 opposite to the first semiconductor layer 10). The first electrode pad 75 is electrically connected to the first electrode 70. The second electrode pad 85 is provided, for example, on the second electrode 80 (on the side of the second electrode 80 opposite to the second semiconductor layer 20). The second electrode pad 85 is electrically connected to the second electrode 80.

Light (an emitted light) is emitted from the light emitting layer 30 by a current flowing in the light emitting layer 30 via the first electrode 70, the first semiconductor layer 10, the second electrode 80, and the second semiconductor layer 20 by applying a voltage between the first electrode pad 75 and the second electrode pad 85.

The second electrode 80 is, for example, transparent to the emitted light. The second electrode 80 may include, for example, an oxide including at least one selected from indium, tin, and zinc.

For example, the transmittance of the second electrode pad 85 with respect to the emitted light is lower than the transmittance of the second electrode 80 with respect to the emitted light. For example, the conductivity of the second electrode pad 85 is higher than the conductivity of the second electrode 80. The second electrode pad 85 may include a single layer or a stacked film of various metals. The second electrode pad 85 may be electrically connected to the second electrode 80; and a configuration may be used in which, for example, the second electrode pad 85 is provided on the second semiconductor layer 20 with an interposed insulating layer, and the second electrode pad 85 is electrically connected to the second electrode 80.

The semiconductor functional layer 90 may further include a multilayered structural body (not illustrated) provided between the first semiconductor layer 10 and the light emitting layer 30. The multilayered structural body is, for example, a superlattice layer. The multilayered structural body may include, for example, multiple GaN layers stacked alternately with multiple InGaN layers along the Z-axis.

An unevenness is formed in the lower surface of the foundation layer 60 or the first semiconductor layer 10 (the surface opposing the substrate 50) by the multiple structural bodies 53 being provided in the substrate 50. In this example, the structural body 53 is the protrusion 50p; and multiple structural body recesses 60d are provided in the foundation layer 60 (or the first semiconductor layer 10). The multiple protrusions 50p of the substrate 50 respectively oppose the multiple structural body recesses 60d of the foundation layer 60. The upper surface of the foundation layer 60 (the surface on the side opposing the first semiconductor layer 10) is flat.

The stacked structural body 10s recited above is formed on the buffer layer 55 that is formed on the substrate 50. The substrate 50 may be separated after the stacked structural body 10s is formed. The buffer layer 55 may be removed when separating the substrate 50. At least a portion of the buffer layer 55 may remain after the substrate 50 is separated.

An example of the configuration of the light emitting layer 30 will now be described.

Figure 3:
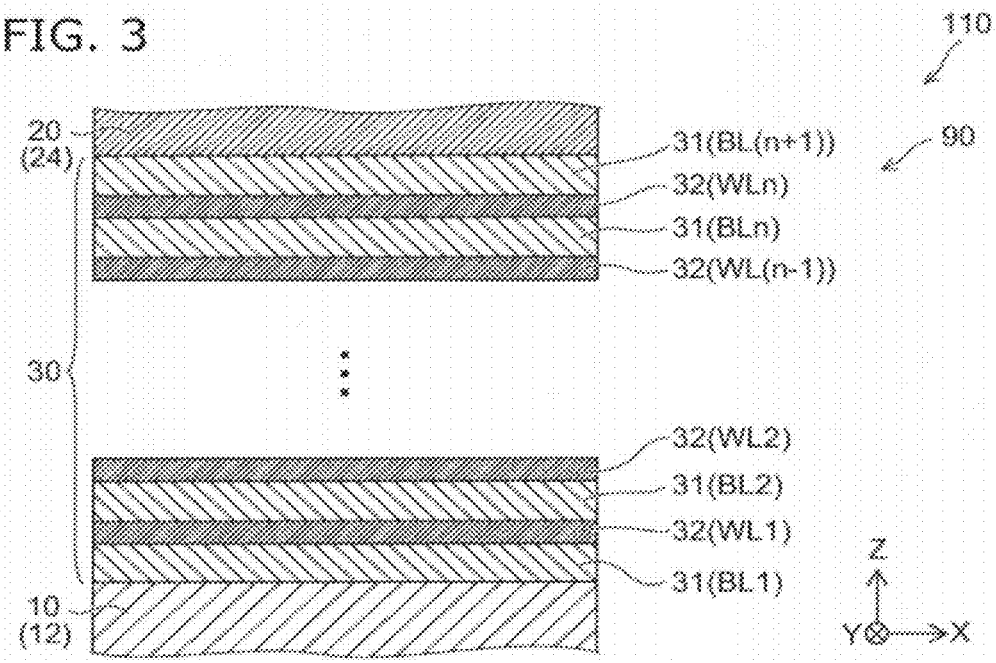
FIG. 3 is a schematic cross-sectional view illustrating a portion of the nitride semiconductor device according to the first embodiment.

FIG. 3 is a schematic cross-sectional view illustrating the configuration of a portion of the nitride semiconductor device according to the first embodiment.

As illustrated in FIG. 3, the light emitting layer 30 includes multiple barrier layers 31 and a well layer 32 provided between the multiple barrier layers 31.

For example, the light emitting layer 30 may have a single quantum well (SQW) structure. In such a case, the light emitting layer 30 includes two barrier layers 31 and the well layer 32 provided between the barrier layers 31. For example, the light emitting layer 30 may have a multiple quantum well (MQW) structure. In such a case, the light emitting layer 30 includes three or more barrier layers 31 and well layers 32 provided between the barrier layers 31.

In the example illustrated in FIG. 3, the light emitting layer 30 includes n+1 barrier layers 31 and n well layers 32 (where n is an integer not less than 1). The (i+1)th barrier layer BL(i+1) is disposed between the second semiconductor layer 20 and the ith barrier layer BLi (where i is an integer not less than 1 and not more than n−1). The (i+1)th well layer WL(i+1) is disposed between the ith well layer WLi and the second semiconductor layer 20. The 1st barrier layer BL1 is provided between the first semiconductor layer 10 and the 1st well layer WL1. The nth well layer WLn is provided between the nth barrier layer BLn and the (n+1)th barrier layer BL(n+1). The (n+1)th barrier layer BL(n+1) is provided between the nth well layer WLn and the second semiconductor layer 20.

The well layer 32 includes a nitride semiconductor that includes a group III element and a group V element. For example, the well layer 32 includes a nitride semiconductor that includes indium (In) and gallium (Ga). In other words, the well layer 32 includes, for example, $In_{xs}Ga_{1-xs}N$ ($0.05 \leq xs \leq 0.5$). The peak wavelength of the light emitted from the light emitting layer 30 (the emitted light) is, for example, not less than 400 nanometers (nm) and not more than 650 nm.

The barrier layer 31 includes a nitride semiconductor that includes a group III element and a group V element. The bandgap energy of the barrier layer 31 is larger than the bandgap energy of the well layer 32.

In the case where the barrier layer 31 includes In, the compositional proportion of In in the group III element of the barrier layer 31 is lower than the compositional proportion of In (the In compositional proportion xs recited above) in the group III element of the well layer 32. Thereby, the bandgap energy of the well layer 32 is smaller than the bandgap energy of the barrier layer 31.

Figure 4:
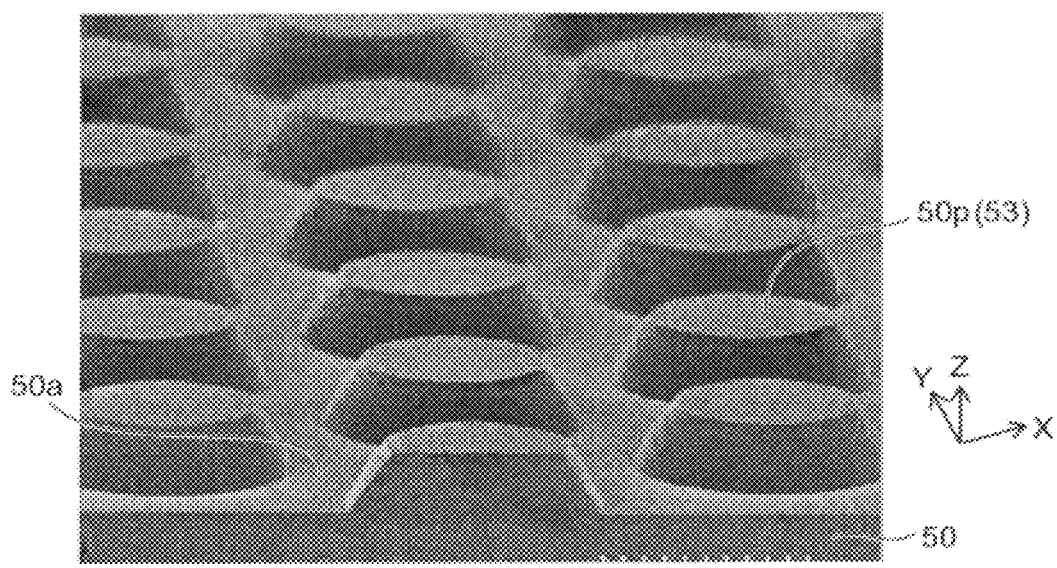
FIG. 4 is an electron microscope photograph illustrating the nitride semiconductor device according to the first embodiment.

FIG. 4 is an electron microscope photograph illustrating the configuration of the nitride semiconductor device according to the first embodiment.

Namely, this figure is a scanning electron microscope (SEM) photograph illustrating the multiple protrusions 50p provided in the substrate 50 of the nitride semiconductor device 110.

As illustrated in FIG. 4, the multiple protrusions 50p are provided on the major surface 50a of the substrate 50. The multiple protrusions 50p are ordered in the X-Y plane.

The height of the protrusion 50p is, for example, about 1 micrometer (μm). The width of the apical portion of the protrusion 50p is, for example, about 3 μm. The spacing (the pitch) between the centers of the multiple protrusions 50p is, for example, 5 μm.

Thus, at least one selected from the height, the width, and the pitch of the multiple protrusions 50p is greater than the wavelength of the light emitted from the light emitting layer 30. Thereby, the improvement effect of the light extraction efficiency increases.

Although the planar configuration of each of the structural bodies 53 (the protrusions 50p) is circular in this example, the embodiment is not limited thereto. Each of the structural bodies 53 (the protrusions 50p) may have any planar configuration such as a triangle, a quadrilateral (including a rectangle, a parallelogram, a diamond, etc.), any polygon including a hexagon, etc., a polygon with rounded corners, and the like.

Figure 5A:
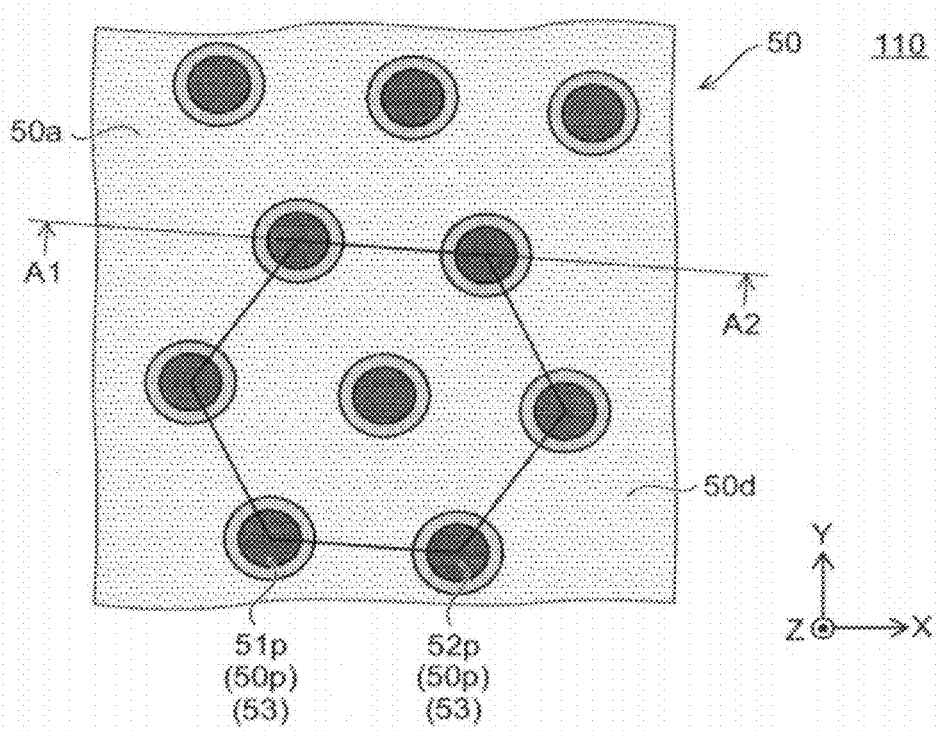
FIG. 5A and FIG. 5B are schematic views illustrating the nitride semiconductor device according to the first embodiment.
Figure 5B:
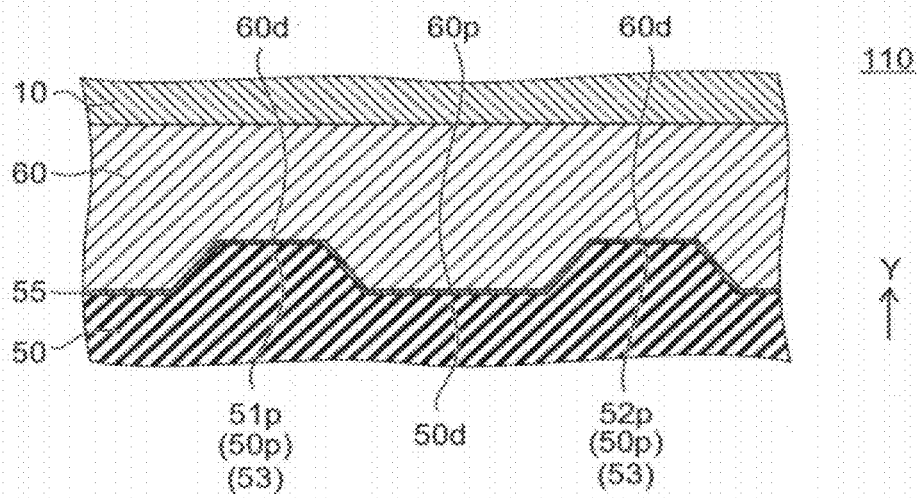

FIG. 5A and FIG. 5B are schematic views illustrating the configuration of the nitride semiconductor device according to the first embodiment.

FIG. 5A is a schematic plan view illustrating the disposition of the multiple structural bodies 53 provided in the substrate 50. FIG. 5B is a cross-sectional view along line A1-A2 of FIG. 5A.

In this example as illustrated in FIG. 5A, a continuous recess 50d and multiple protrusions 50p (multiple structural bodies 53) are provided in the substrate 50.

As illustrated in FIG. 5B, a continuous structural body protrusion 60p and multiple structural body recesses 60d are provided in the foundation layer 60. The positions of the multiple structural body recesses 60d in the X-Y plane substantially match the positions of the multiple protrusions 50p of the substrate 50 in the X-Y plane. Accordingly, the following description relating to the characteristics of the protrusions 50p of the substrate 50 in the X-Y plane (e.g., the planar configuration, the disposition, and the like) can be applied also to the characteristics of the structural body recess 60d in the X-Y plane (e.g., the planar configuration, the disposition, and the like).

As illustrated in FIG. 5A, the multiple protrusions 50p (the structural bodies 53) of the substrate 50 are disposed respectively, for example, at the center and the six corners of a regular hexagon. For example, the multiple protrusions 50p are formed in a repeating pattern in the major surface 50a of the substrate 50. For example, the multiple protrusions 50p are formed by selectively etching a region of the major surface 50a of the substrate 50 other than the multiple protrusions 50p.

In the nitride semiconductor device 110 according to the embodiment, the relationship between the disposition of the multiple protrusions 50p in the X-Y plane and the crystal lattice of the substrate 50 is defined. In other words, an axis of the disposition of the multiple protrusions 50p in the X-Y plane is set to be non-parallel (i.e., a state having a rotational shift) to an axis of the crystal lattice of the substrate 50.

FIG. 1A and FIG. 1B illustrate the rotational shift of the axis of the nitride semiconductor device 110.

FIG. 1A schematically illustrates the disposition of the multiple protrusions 50p in the X-Y plane. FIG. 1B schematically illustrates the crystal lattice of the substrate 50.

As illustrated in FIG. 1A, one nearest direction of the multiple structural bodies 53 (in this example, the protrusions 50p) is taken as a structural body axis direction SA. The structural body axis direction SA is parallel to, for example, one side of the hexagon of the disposition of the multiple protrusions 50p.

As illustrated in FIG. 1B, the substrate 50 has a crystal lattice 50c. In the case where the substrate 50 is sapphire, the substrate 50 is a hexagonal crystal. The crystal lattice 50c of the substrate 50 has a hexagon portion when the substrate 50 is viewed along the Z-axis. A nearest direction of the crystal lattice 50c in the plane parallel to the major surface 50a is taken as a lattice axis direction LA. When viewed along the Z-axis, the lattice axis direction LA is parallel to one side of the hexagon of the crystal lattice 50c.

In the nitride semiconductor device 110 according to the embodiment as illustrated in FIG. 1A, the structural body axis direction SA is not parallel to the lattice axis direction LA. For example, the absolute value of an angle θ1 between the structural body axis direction SA and the lattice axis direction LA is set to be not less than 1 degree and not more than 10 degrees.

For example, the structural body axis direction SA is the direction of an axis connecting a first protrusion 51p, which is one of the multiple protrusions 50p, to a second protrusion 52p, which is one other of the multiple protrusions 50p nearest the first protrusion 51p. For example, the lattice axis direction LA is the direction of an axis connecting two lattice points of the crystal lattice 50c of the substrate 50 nearest each other in a plane parallel to the major surface 50a.

For example, in the case where the substrate 50 has a crystal structure of the hexagonal crystal system, the lattice axis direction LA (the nearest direction of the crystal lattice 50c of the substrate 50 in the plane parallel to the major surface 50a) is parallel to an m-plane (one of the multiple m-planes) of the crystal structure.

Thus, the absolute value of the angle θ1 between the nearest direction of the arrangement of the multiple structural bodies 53 (the structural body axis direction SA) and the nearest direction of the crystal lattice 50c of the substrate 50 in the plane parallel to the major surface 50a (the lattice axis direction LA) is set to be not less than 1 degree and not more than 10 degrees. In other words, these directions are set to be non-parallel to each other.

Thereby, a nitride semiconductor device having a high efficiency can be provided.

Figure 6:
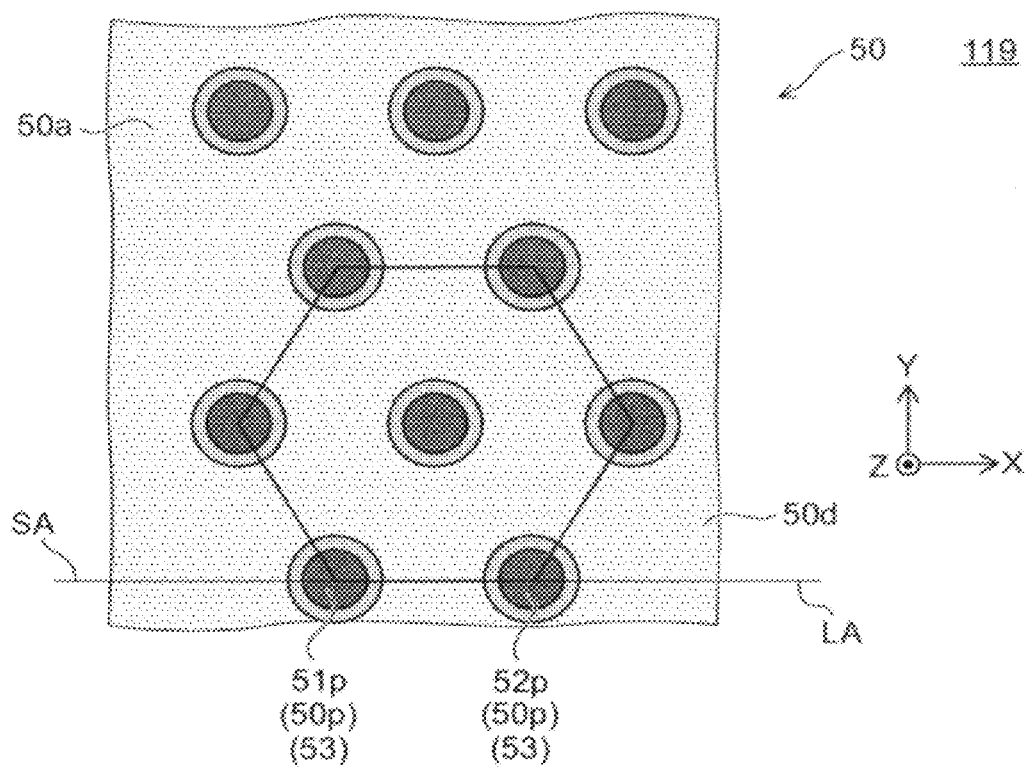
FIG. 6 is a schematic plan view illustrating a nitride semiconductor device of a reference example.

FIG. 6 is a schematic plan view illustrating the configuration of a nitride semiconductor device of a reference example.

This drawing schematically illustrates the disposition in the X-Y plane of the multiple protrusions 50p of the nitride semiconductor device 119 of the reference example.

The disposition of the multiple protrusions 50p of the nitride semiconductor device 119 in the X-Y plane differs from that of the nitride semiconductor device 110. Otherwise, the nitride semiconductor device 119 is similar to the nitride semiconductor device 110; and a description is therefore omitted.

In the nitride semiconductor device 119 of the reference example as illustrated in FIG. 6, the absolute value of the angle θ1 between the structural body axis direction SA and the lattice axis direction LA is substantially 0 degrees. In other words, the structural body axis direction SA is provided along the lattice axis direction LA.

In the case where the structural body axis direction SA is set to be parallel to another side of the hexagon of the disposition of the multiple structural bodies 53 in the X-Y plane, the absolute value of the angle θ01 is 60 degrees, 120 degrees, etc. In other words, the absolute value of the angle θ1 of the reference example is 60×m degrees (where m is an integer). Accordingly, the absolute value of the angle θ1 of the reference example does not become 1 degree to 10 degrees.

On the other hand, in the nitride semiconductor device 110 illustrated in FIG. 1A, in the case where the structural body axis direction SA is set to be parallel to another side of the hexagon of the disposition of the multiple structural bodies 53 in the X-Y plane, the absolute value of the angle θ1 is 60×m±α degrees (where α is not less than 1 degree and not more than 10 degrees). In the embodiment, the absolute value of the angles θ1 that can have different values according to the axis of the disposition of interest is set to be 60×m±α degrees (where α is not less than 1 degree and not more than 10 degrees). In other words, in the embodiment, there exists a combination of the structural body axis direction SA and the lattice axis direction LA where the absolute value of the angle θ1 is not less than 1 degree and not more than 10 degrees.

The nitride semiconductor devices 110 and 119 having configurations such as those recited above were constructed; and the characteristics were evaluated.

The method for constructing the nitride semiconductor device 110 will now be described. This construction method corresponds to one example of the method for manufacturing the nitride semiconductor device according to the embodiment.

For example, a mask having a configuration corresponding to the multiple structural bodies 53 (in this example, the multiple protrusions 50p) is formed on the major surface 50a of the substrate 50 made of sapphire. The portion of the surface of the substrate 50 not covered with the mask is etched. Thereby, the multiple protrusions 50p and the continuous recess 50d are formed. In this example, the absolute value of the angle θ1 between the structural body axis direction SA and the lattice axis direction LA was 4 degrees.

The crystals of the buffer layer 55 and the stacked structural body 10s are grown on the major surface 50a of the substrate 50. For example, metal organic chemical vapor deposition (MOCVD) is used in this crystal growth. Also, the crystal growth may be performed using molecular beam epitaxy (MBE).

A GaN layer used to form the buffer layer 55 is grown on the major surface 50a of the substrate 50. Then, crystal growth of an n-type GaN layer used to form the first n-side layer 11 on the buffer layer 55 is performed.

The n-type impurity introduced to the first semiconductor layer 10 may include various elements such as Si, Ge, Sn, and the like. In this example, Si is used. The doping amount of the Si in the first n-side layer 11 is, for example, about $2 \times 10^{18}$ cm$^{-3}$.

Crystal growth of an n-type GaN layer used to form the second n-side layer 12 on the first n-side layer 11 is performed. The doping amount of the Si in the second n-side layer 12 is, for example, about $1 \times 10^{18}$ cm$^{-3}$. The thickness of the second n-side layer 12 is about 0.1 μm.

The growth temperature of the first n-side layer 11 and the second n-side layer 12 is, for example, not less than 1000° C. and not more than 1100° C.

In the embodiment, for example, an $In_{0.01}Ga_{0.99}N$ layer having a thickness of about 0.1 μm may be used as the second n-side layer 12. In the case where $In_{0.01}Ga_{0.99}N$ layer is used as the second n-side layer 12, the growth temperature of the second n-side layer 12 is, for example, not less than 700° C. and not more than 800° C.

The light emitting layer 30 is formed on the second n-side layer 12. In other words, the multiple barrier layers 31 and the multiple well layers 32 are alternately formed. The barrier layer 31 may include, for example, an $In_{0.02}Ga_{0.98}N$ layer. The thickness of one barrier layer 31 is, for example, about 12.5 nm. The well layer 32 may include, for example, an undoped $In_{0.2}Ga_{0.8}N$ layer. The thickness of one well layer 32 is, for example, 2.5 nm. The growth temperature of the barrier layer 31 and the well layer 32 is, for example, not less than 700° C. and not more than 800° C. In this example, the barrier layer 31 and the well layer 32 are designed such that the peak wavelength of the photoluminescence of the light emitting layer 30 at room temperature is 450 nm. In this example, the number of the well layers 32 is eight.

The second semiconductor layer 20 is formed on the light emitting layer 30. For example, various elements such as Mg, Zn, and the like may be used as the p-type impurity of the second semiconductor layer 20. In this example, Mg is used.

Specifically, the p-type GaN layer used to form the fourth p-side layer 24 is grown on the light emitting layer 30. The thickness of the fourth p-side layer 24 is about 30 nm. The growth temperature of the fourth p-side layer 24 is, for example, not less than 1000° C. and not more than 1100° C. The doping amount of the Mg in the fourth p-side layer 24 is, for example, about $4 \times 10^{18}$ cm$^{-3}$.

For example, an $In_{0.01}Ga_{0.99}N$ layer having a thickness of about 30 nm may be used as the fourth p-side layer 24. In the case where the $In_{0.01}Ga_{0.99}N$ layer is used as the fourth p-side layer 24, the growth temperature of the fourth p-side layer 24 is, for example, not less than 700° C. and not more than 800° C.

The p-type AlGaN layer used to form the third p-side layer 23 is grown on the fourth p-side layer 24. The p-type AlGaN layer is, for example, an $Al_{0.2}Ga_{0.8}N$ layer. The thickness of the third p-side layer 23 is about 10 nm. The doping amount of the Mg in the third p-side layer 23 is, for example, about $4 \times 10^{18}$ cm$^{-3}$. The growth temperature of the third p-side layer 23 is, for example, not less than 1000° C. and not more than 1100° C.

A p-type GaN layer used to form the second p-side layer 22 is grown on the third p-side layer 23. The doping amount of the Mg in the second p-side layer 22 is, for example, about $1 \times 10^{19}$ cm$^{-3}$. The thickness of the second p-side layer 22 is, for example, about 50 nm. The growth temperature of the second p-side layer 22 is, for example, not less than 1000° C. and not more than 1100° C.

A p-type GaN layer used to form the first p-side layer 21 is grown on the second p-side layer 22. The doping amount of the Mg in the first p-side layer 21 is, for example, about $1 \times 10^{20}$ cm$^{-3}$. The thickness of the first p-side layer 21 is, for example, about 60 nm.

Thus, the stacked structural body 10s is formed on the substrate 50. Then, the following device processes are performed on the stacked structural body 10s.

An ITO layer used to form the second electrode 80 is formed on the first p-side layer 21. The thickness of the ITO film is, for example, about 200 nm.

Subsequently, a portion of the first n-side layer 11 is exposed by performing dry etching on a region of a portion of the ITO film, the second semiconductor layer 20, the light emitting layer 30, and the second n-side layer 12. The first electrode 70 is formed on the exposed first n-side layer 11. For example, a stacked film of a Ti film/Pt film/Au film may be used as the first electrode 70. The thickness of the Ti film is about 0.05 μm. The thickness of the Pt film is about 0.05 μm. The thickness of the Au film is about 0.2 μm.

The first electrode pad 75 is formed on the first electrode 70; and the second electrode pad 85 is formed on the second electrode 80. In other words, for example, a Au film having a film thickness of about 1.0 μm is formed on the first electrode 70 and the second electrode 80. This Au film is used to form the first electrode pad 75 and the second electrode pad 85.

Thereby, the nitride semiconductor device 110 illustrated in FIGS. 1A and 1B is formed.

On the other hand, the multiple protrusions 50p and the continuous recess 50d are formed while changing the disposition of the openings of the mask formed on the major surface 50a of the substrate 50 made of sapphire. The disposition of the multiple protrusions 50p in the X-Y plane is as illustrated in FIG. 6. The nitride semiconductor device 119 of the reference example is formed using the substrate 50 by implementing processes similar to those recited above.

The crystallinity of the semiconductor functional layers 90 of the nitride semiconductor devices 110 and 119 was evaluated using X-ray diffraction. In the evaluation, the crystallinity of the semiconductor functional layers 90 in the X-Y plane was evaluated. In the evaluation, the X-ray diffraction intensity was measured for the two planes of the GaN (11-24) plane and the GaN (20-24) plane.

Figure 7A:
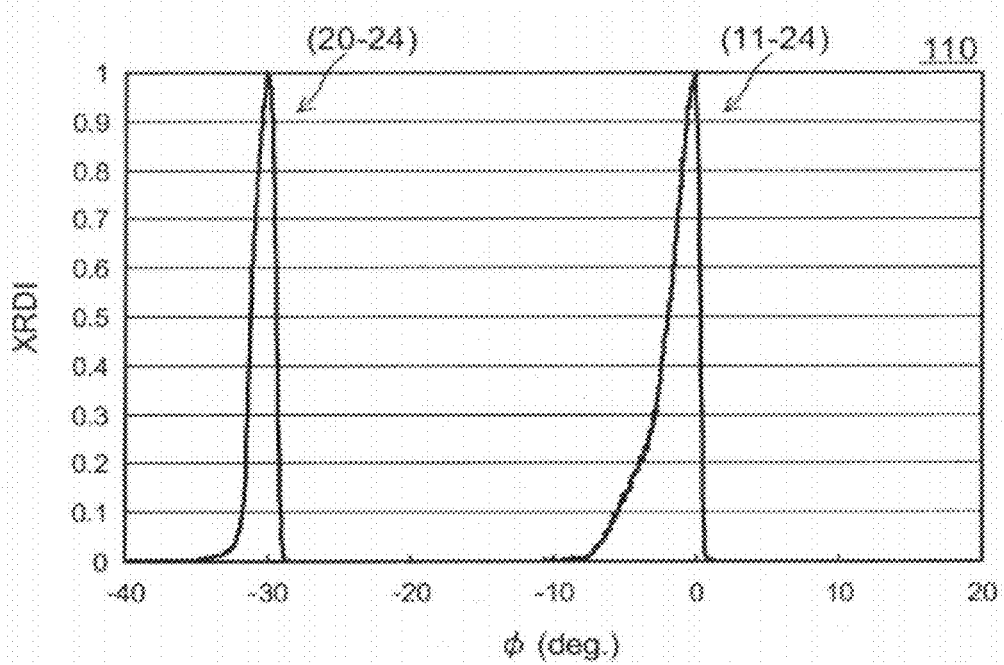
FIG. 7A and FIG. 7B are graphs illustrating characteristics of the nitride semiconductor devices.
Figure 7B:
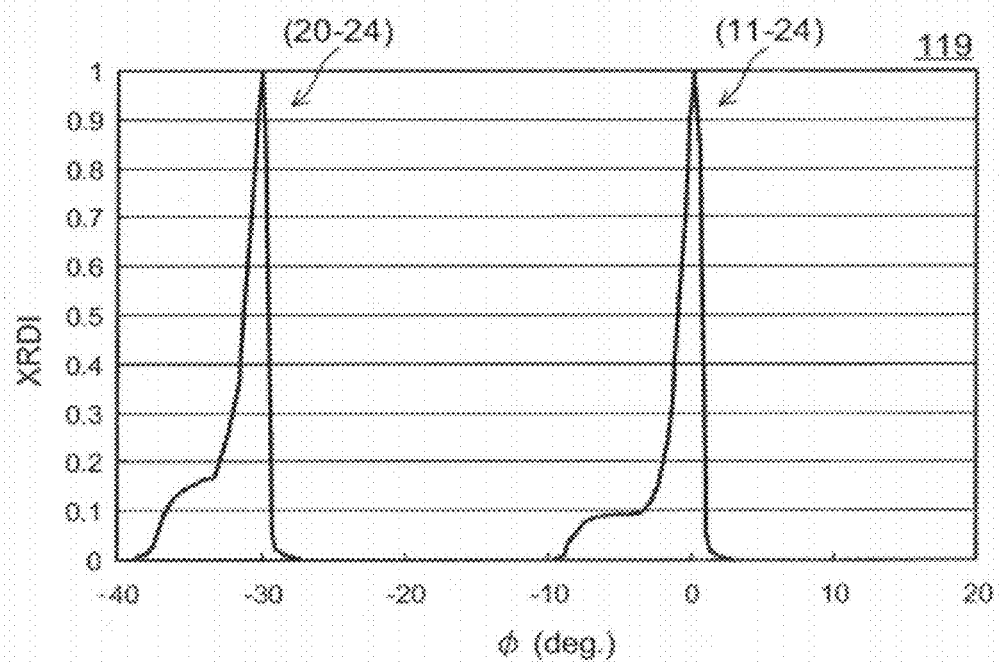

FIG. 7A and FIG. 7B are graphs illustrating characteristics of the nitride semiconductor devices.

FIG. 7A illustrates characteristics of the nitride semiconductor device 110; and FIG. 7B illustrates characteristics of the nitride semiconductor device 119. In these graphs, the horizontal axis is a rotation angle $\phi$; and the vertical axis is an X-ray diffraction intensity XRDI (a relative value).

As illustrated in FIG. 7A and FIG. 7B, there are two peaks corresponding to rotation angles $\phi$ of about 0 degrees and about −30 degrees. The peak occurring when the rotation angle $\phi$ is about 0 degrees corresponds to the (11-24) plane of the GaN; and the peak occurring when the rotation angle $\phi$ is about −30 degrees corresponds to the (20-24) plane of the GaN.

In the nitride semiconductor device 119 of the reference example as illustrated in FIG. 7B, the peaks of the (11-24) plane and the (20-24) plane have large shoulder-like regions from the main peaks (the peaks of 0 degrees and −30 degrees) to positions in the negative direction from the rotation angles $\phi$.

Conversely, in the nitride semiconductor device 110 according to the embodiment as illustrated in FIG. 7A, the shoulder-like regions are extremely small compared to those of the nitride semiconductor device 119. In other words, these are substantially single peaks. Thus, in the nitride semiconductor device 110, X-ray diffraction peaks that are substantially single X-ray diffraction peaks are obtained. Thus, the crystallinity of the semiconductor functional layer 90 of the nitride semiconductor device 110 is high.

The X-ray rocking curve of the (11-24) plane and the X-ray rocking curve of the (20-24) plane reflect the twist component of the GaN and have a correlation with the edge dislocation density.

In the embodiment, the X-ray rocking curve at these planes has substantially single peaks; and the fluctuation of the twist component of the crystal of the semiconductor functional layer 90 decreases. Thereby, the edge dislocation density of the GaN is reduced. Thereby, a high internal quantum efficiency is obtained in the nitride semiconductor device 110.

The light emission characteristics of these nitride semiconductor devices were measured. As a result, the light output of the nitride semiconductor device 110 for prescribed operating conditions was 24.5 milliwatts (mW). On the other hand, the light output of the nitride semiconductor device 119 for these operating conditions was 23.7 mW. Thus, according to the embodiment, a light output higher than that of the reference example is obtained. Thus, according to the embodiment, a nitride semiconductor device having a high efficiency can be provided.

Also in the reference example in which the structural body axis direction SA is provided along the lattice axis direction LA, the angle $\theta 1$ between the structural body axis direction SA and the lattice axis direction LA may shift from 0 degrees due to fluctuation of the manufacturing processes and the like. However, the angle $\theta 1$ that occurs unintentionally due to the fluctuation of the manufacturing processes and the like of the reference example in which the structural body axis direction SA is provided along the lattice axis direction LA is not more than 0.2 degrees. In other words, in the reference example in which the structural body axis direction SA is substantially parallel to the lattice axis direction LA, the angle $\theta 1$ is not more than 0.2 degrees. Conversely, in the embodiment, the structural body axis direction SA is intentionally rotated from the lattice axis direction LA.

As illustrated in FIG. 7A, the X-ray diffraction intensity XRDI spreads about 1 degree to 2 degrees in the positive direction from the rotation angles $\phi$ where the peaks occur. As illustrated in FIG. 7B, the rotation angle $\phi$ of the shoulder-like region of the X-ray diffraction intensity XRDI occurring in the reference example spreads (has a shoulder-like region) of about 10 degrees.

Investigations based on such characteristics show that, in the embodiment, a practically sufficient effect of increasing the crystallinity of the semiconductor functional layer 90 can be obtained by the absolute value of the angle $\theta 1$ between the structural body axis direction SA and the lattice axis direction LA being not less than 1 degree and not more than 10 degrees.

It is more desirable for the angle $\theta 1$ to be not less than 3 degrees and not more than 5 degrees. Thereby, the effect of increasing the crystallinity of the semiconductor functional layer 90 is even higher; and a nitride semiconductor device having higher efficiency can be obtained more easily.

When the angle $\theta 1$ is larger than 10 degrees, there are cases where the fillability worsens when filling the unevenness of the structural bodies 53 of the substrate 50 with the semiconductor functional layer 90 (e.g., the first semiconductor layer 10, the foundation layer 60, etc.). A high crystallinity and a high fillability are obtained by the angle $\theta 1$ being not more than 10 degrees.

The structural body axis direction SA can be determined from the configuration and the disposition of the multiple structural bodies 53 provided in the substrate 50. The structural body axis direction SA also can be determined based on analysis results of the semiconductor functional layer 90 which has an uneven configuration that reflects the uneven configuration of the substrate 50. The configuration of the unevenness can be determined by, for example, viewing the nitride semiconductor device with an electron microscope and the like. In such a case, the sample may be analyzed by removing at least a portion of the components included in the nitride semiconductor device if necessary.

The lattice axis direction LA can be determined, for example, by analyzing the substrate 50 using X-ray diffraction.

Figure 8A:
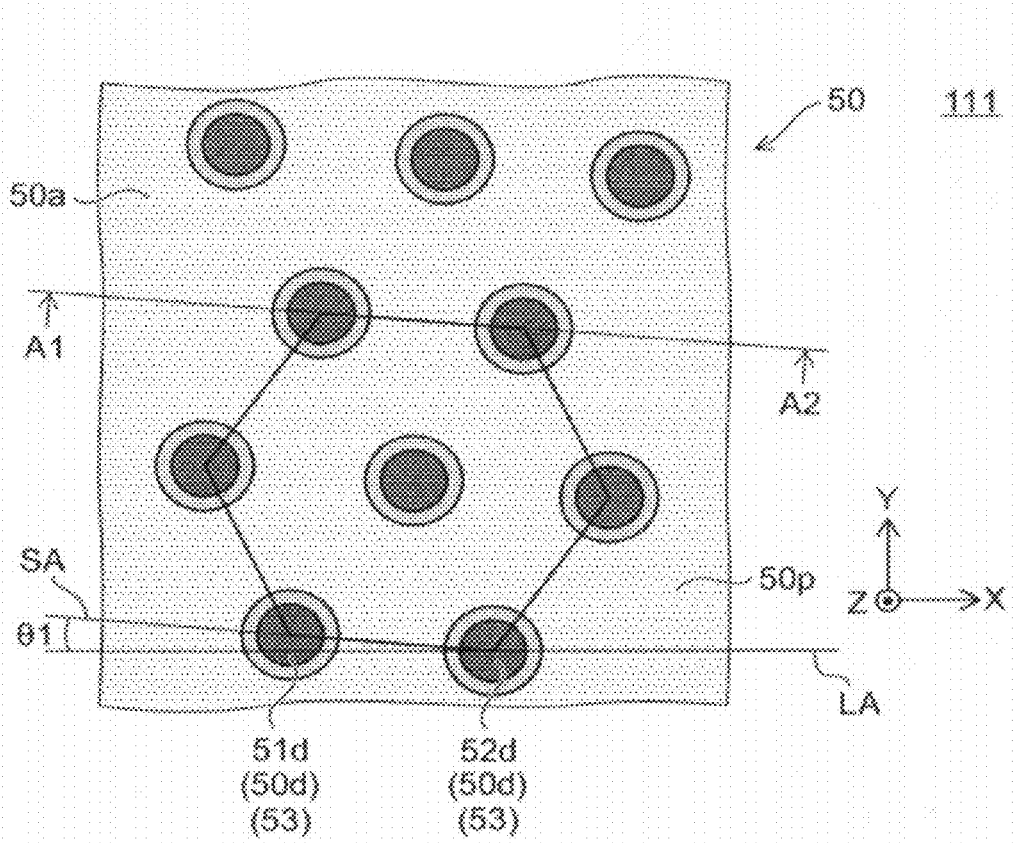
FIG. 8A and FIG. 8B are schematic views illustrating another nitride semiconductor device according to the first embodiment.
Figure 8B:
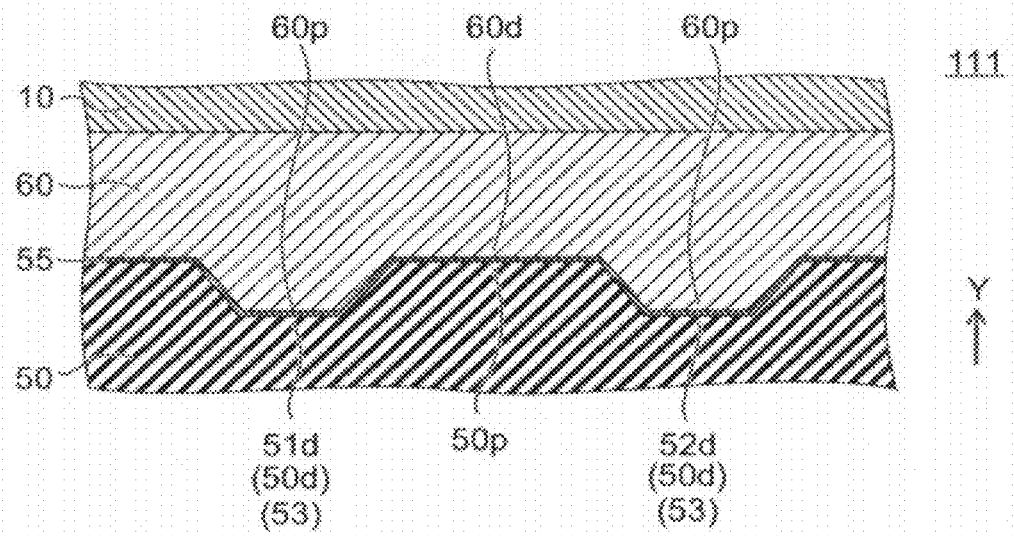

FIG. 8A and FIG. 8B are schematic views illustrating the configuration of another nitride semiconductor device according to the first embodiment.

FIG. 8A is a schematic plan view illustrating the disposition of the multiple structural bodies 53 provided in the substrate 50. FIG. 8B is a cross-sectional view along line A1-A2 of FIG. 8A.

In this example as illustrated in FIG. 8A, the continuous protrusion 50p and the multiple recesses 50d (the multiple structural bodies 53) are provided in the substrate 50. In other words, in this example, the structural body 53 is the recess 50d.

As illustrated in FIG. 8B, in such a case, the continuous structural body recess 60d and the multiple structural body protrusions 60p are provided in the foundation layer 60. The positions of the multiple structural body protrusions 60p in the X-Y plane substantially match the positions of the multiple recesses 50d of the substrate 50 in the X-Y plane, respectively. Accordingly, the following description relating to the characteristics of the recess 50d of the substrate 50 in the X-Y plane (e.g., the planar configuration, the disposition, and the like) can be applied also to the characteristics of the structural body protrusion 60p (e.g., the planar configuration, the disposition, and the like) in the X-Y plane.

As illustrated in FIG. 8A, the multiple recesses 50d (the structural bodies 53) of the substrate 50 are disposed respectively, for example, at the center and the six corners of a regular hexagon when viewed along the Z-axis. The relationship between the disposition of the multiple recesses 50d in the X-Y plane and the crystal lattice of the substrate 50 is defined. In other words, the axis of the disposition of the multiple recesses 50d in the X-Y plane is set to be non-parallel to the axis of the crystal lattice of the substrate 50.

For example, the absolute value of the angle θ1 between the structural body axis direction SA and the lattice axis direction LA is set to be not less than 1 degree and not more than 10 degrees. The structural body axis direction SA is, for example, the direction of an axis connecting a first recess 51d, which is one of the multiple recesses 50d, to a second recess 52d, which is one other of the multiple recesses 50d nearest the first recess 51d. In such a case as well, the lattice axis direction LA is, for example, the direction of an axis connecting two lattice points of the crystal lattice 50c of the substrate 50 nearest each other in the plane parallel to the major surface 50a.

The crystallinity of the semiconductor functional layer 90 improves by the absolute value of the angle ∂41 between the structural body axis direction SA and the lattice axis direction LA being not less than 1 degree and not more than 10 degrees. Thereby, for example, the edge dislocation density of the GaN is reduced. Thereby, a high efficiency is obtained. Also, a high light output is obtained.

Thus, according to the nitride semiconductor device 111, a nitride semiconductor device having a high efficiency can be provided.

In such a case as well, at least one selected from the depth, the width, and the pitch of the multiple recesses 50d is greater than the wavelength of the light emitted from the light emitting layer 30. Thereby, the improvement effect of the light extraction efficiency increases.

In the embodiment, the multiple structural bodies 53 (the protrusions 50p or the recesses 50d) are provided in the substrate 50. When a polygon corresponding to the basic period of the multiple structural bodies 53 is drawn, the direction of the polygon differs from the in-plane orientation of the substrate 50. In other words, the angle between the directions of the polygon and the in-plane orientation of the substrate 50 is set to be not less than 1 degree and not more than 10 degrees. Thereby, the dislocation density and the pit density of the GaN semiconductor is reduced; and the crystallinity improves. Thereby, the efficiency improves.

Although conventionally, various contrivances have been implemented relating to the configuration and the disposition of the multiple structural bodies 53 (the protrusions or the recesses), the relationship between the crystal lattice 50c and the disposition of the multiple structural bodies 53 has not been considered.

Conversely, in the embodiment, the relationship between the disposition of the multiple structural bodies 53 in the X-Y plane and the crystal lattice of the substrate 50 is defined. In other words, the axis of the disposition of the multiple structural bodies 53 in the X-Y plane (the structural body axis direction SA) is set to be non-parallel to the axis of the crystal lattice 50c of the substrate 50 (the lattice axis direction LA). Thereby, the X-ray diffraction peaks are substantially single peaks. In other words, the crystallinity improves. Thereby, a high efficiency is obtained.

Figure 9:
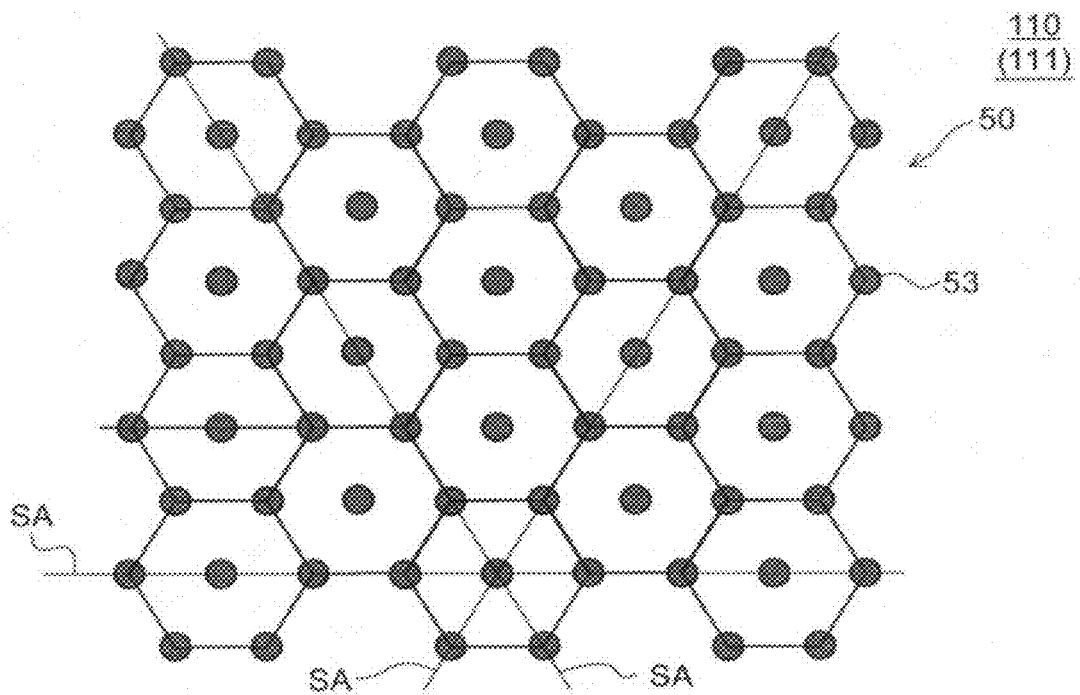
FIG. 9 is a schematic plan view illustrating the nitride semiconductor device according to the first embodiment.

FIG. 9 is a schematic plan view illustrating the configuration of the nitride semiconductor device according to the first embodiment.

This drawing illustrates the disposition of the multiple structural bodies 53 on the major surface 50a of the substrate 50. The structural body 53 is the protrusion 50p or the recess 50d. In other words, this drawing illustrates the disposition of the multiple structural bodies 53 of the nitride semiconductor device 110 or 111.

As illustrated in FIG. 9, the multiple structural bodies 53 are repeatedly disposed at the positions of the center and the six corners of the hexagons, respectively. In the embodiment, the axis of the disposition of the multiple structural bodies 53 in the X-Y plane (i.e., the structural body axis direction SA which is the nearest direction) may be in at least three directions. The absolute value of the angle θ1 between one of these three directions and the lattice axis direction LA is not less than 1 degree and not more than 10 degrees.

In the example illustrated in FIG. 9, the multiple structural bodies 53 are ordered with high precision at the positions of the center and the six corners of the hexagons, respectively.

Figure 10:
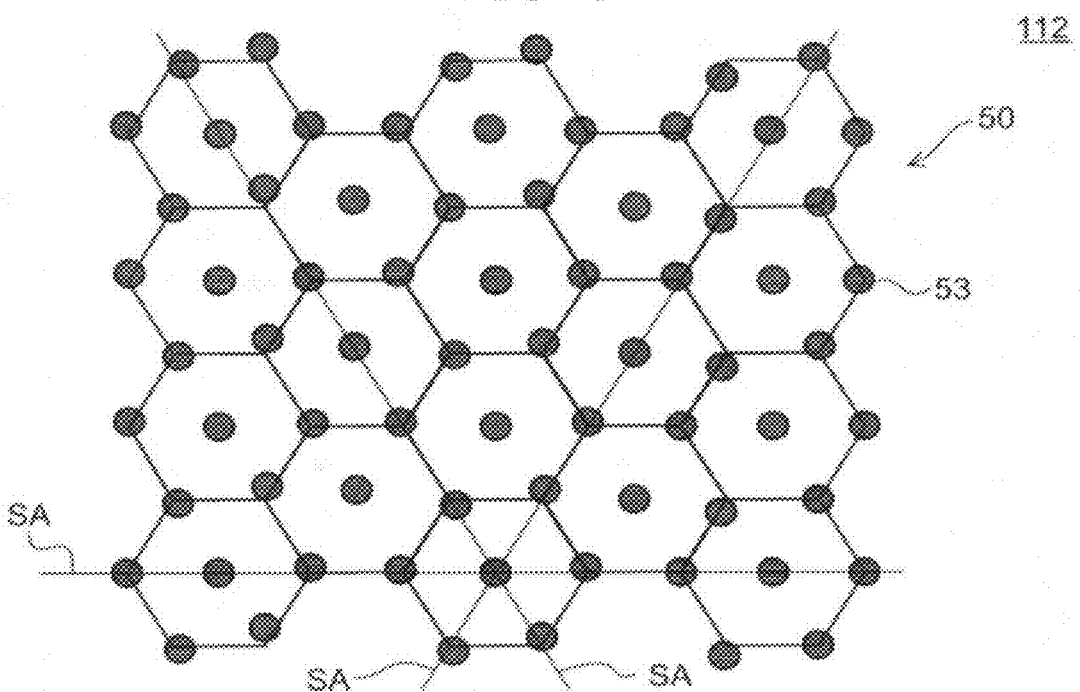
FIG. 10 is a schematic plan view illustrating another nitride semiconductor device according to the first embodiment.

FIG. 10 is a schematic plan view illustrating the configuration of another nitride semiconductor device according to the first embodiment.

This drawing illustrates the disposition of the multiple structural bodies 53 on the major surface 50a of the substrate 50. The structural body 53 is the protrusion 50p or the recess 50d.

In the nitride semiconductor device 112 according to the embodiment as illustrated in FIG. 10, portions of the multiple structural bodies 53 are shifted short distances from the positions of the center and the six corners of the hexagons.

Thus, for example, the multiple protrusions 50p are substantially ordered in the major surface 50a of the substrate 50.

As illustrated in FIG. 10, even in the case where the portions of the multiple structural bodies 53 are shifted short distances, the nearest direction of the disposition of the multiple structural bodies 53 (the structural body axis direction SA) can be defined. In such a case as well, the nitride semiconductor device 112 has three structural body axis directions SA. The absolute value of the angle θ1 between one of these three directions and the lattice axis direction LA is set to be not less than 1 degree and not more than 10 degrees.

Second Embodiment

Figure 11:
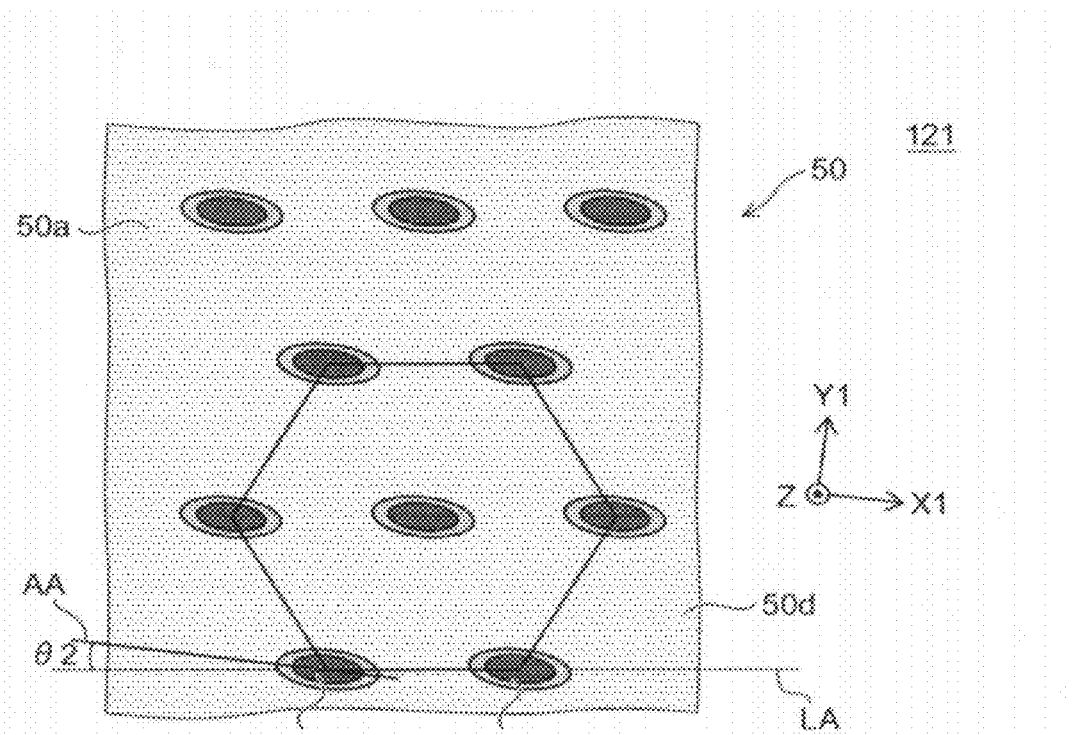
FIG. 11 is a schematic plan view illustrating a nitride semiconductor device according to a second embodiment.

FIG. 11 is a schematic plan view illustrating the configuration of a nitride semiconductor device according to a second embodiment.

This drawing schematically illustrates the configuration and the disposition in the X-Y plane of the multiple structural bodies 53 of the nitride semiconductor device 121 according to the second embodiment.

The nitride semiconductor device 121 also includes the substrate 50 of a single crystal and the semiconductor functional layer 90 that includes a nitride semiconductor provided on the major surface 50a of the substrate 50. The substrate 50 includes, for example, the multiple structural bodies 53 disposed two-dimensionally in the major surface 50a. The configuration and the disposition of the multiple structural bodies 53 in the X-Y plane of the nitride semiconductor device 121 differ from those of the nitride semiconductor device 110. Otherwise, the configuration of the nitride semiconductor device 121 is similar to that of the nitride semiconductor device 110; and a description is therefore omitted.

In the nitride semiconductor device 121 as well, each of the multiple structural bodies 53 is the protrusion 50p provided on the major surface 50a or the recess 50d provided on the major surface 50a. In this example, the structural body 53 is the protrusion 50p.

As illustrated in FIG. 11, the planar configuration of each of the multiple structural bodies 53 (in this example, the protrusions 50p) cut by a plane parallel to the major surface 50a is anisotropic along two mutually perpendicular axes parallel to the major surface 50a.

In this example, the planar configuration of the structural body 53 is an ellipse. The ellipse has a major axis and a minor axis. For example, the major axis is one axis (e.g., an X1-axis) perpendicular to the Z-axis; and the minor axis is one other axis (e.g., a Y1-axis) perpendicular to the Z-axis. In other words, in this example, two mutually perpendicular axes of the planar configuration of the structural body 53 that are parallel to the major surface 50a are the X1-axis and the Y1-axis. The two lengths relating to the X1-axis and the Y1-axis (e.g., the length of the major axis and the length of the minor axis) are different from each other. Thus, "anisotropic" includes the state in which two lengths relating to two mutually perpendicular axes of the planar configuration of the structural body 53 that are parallel to the major surface 50a are different from each other.

Then, in the case where the planar configuration of the structural body 53 is anisotropic, the X1-axis or the Y1-axis is the anisotropic axis. In the nitride semiconductor device 121 according to the embodiment, the absolute value of an angle θ2 between an anisotropic axis direction AA (e.g., parallel to the X1-axis direction) and the nearest direction of the crystal lattice 50c of the substrate 50 in the plane parallel to the major surface 50a (the lattice axis direction LA) is not less than 1 degree and not more than 10 degrees. Thereby, the fluctuation of the twist component of the crystal of the semiconductor functional layer 90 decreases. Thereby, for example, the edge dislocation density of the GaN decreases; and a high internal quantum efficiency is obtained.

Figure 12:
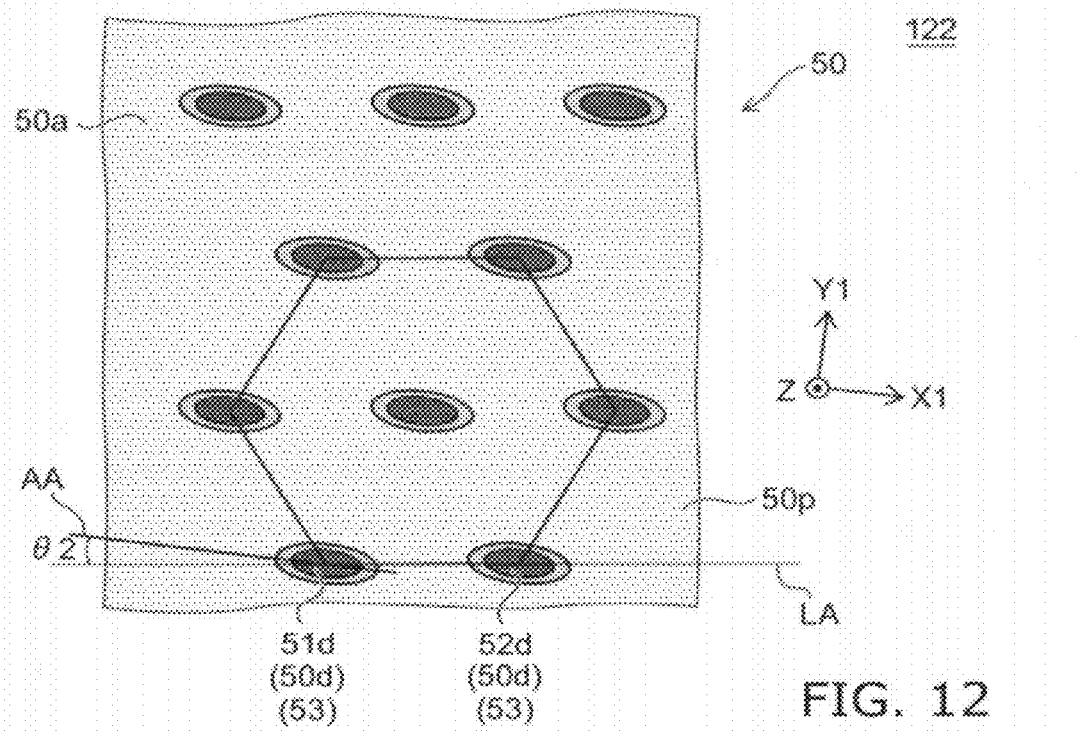
FIG. 12 is a schematic plan view illustrating another nitride semiconductor device according to the second embodiment.

FIG. 12 is a schematic plan view illustrating the configuration of another nitride semiconductor device according to the second embodiment.

This drawing schematically illustrates the configuration and the disposition in the X-Y plane of the multiple structural bodies 53 of the nitride semiconductor device 122 according to the second embodiment. In such a case, the structural body 53 is the recess 50d.

As illustrated in FIG. 12, in such a case as well, the planar configuration of each of the multiple structural bodies 53 (in this example, the recesses 50d) cut by a plane parallel to the major surface 50a is an ellipse. In other words, the planar configuration of the multiple structural bodies 53 is anisotropic along two mutually perpendicular axes parallel to the major surface 50a.

The absolute value of the angle θ2 between the anisotropic axis direction AA and the lattice axis direction LA is not less than 1 degree and not more than 10 degrees.

In the nitride semiconductor device 122 as well, the fluctuation of the twist component of the crystal of the semiconductor functional layer 90 decreases. Thereby, for example, the edge dislocation density of the GaN is reduced; and a high internal quantum efficiency is obtained.

Figure 13A:
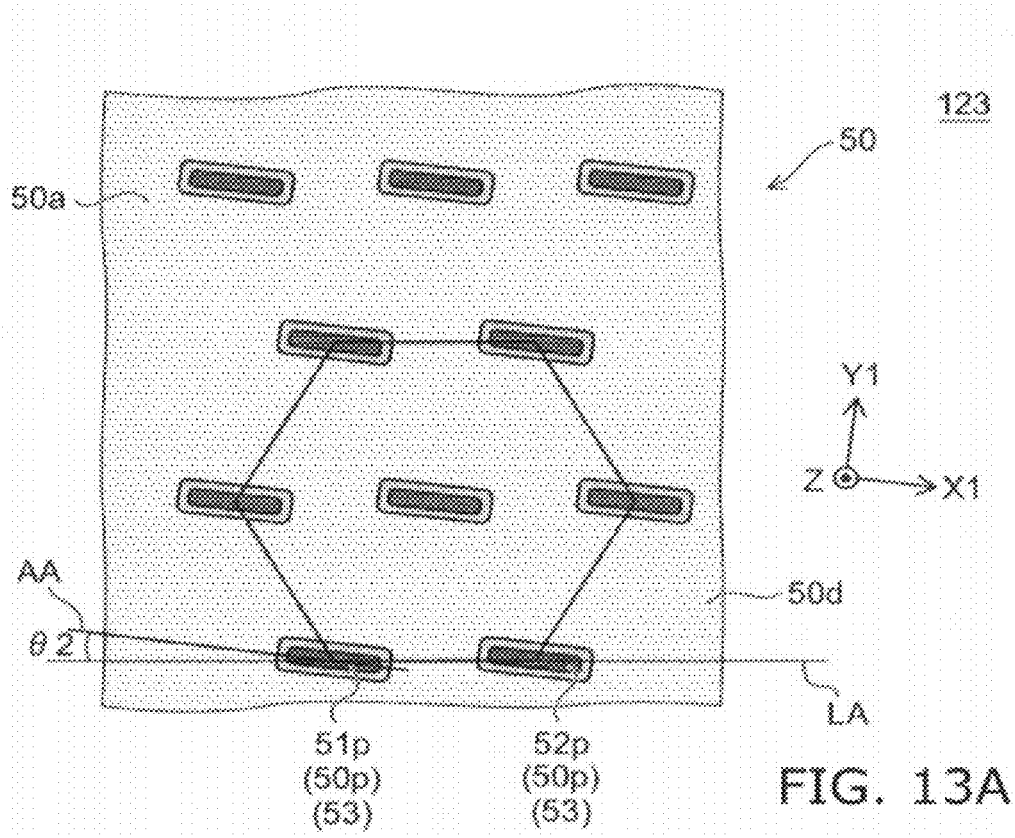
FIG. 13A and FIG. 13B are schematic plan views illustrating other nitride semiconductor devices according to the second embodiment.
Figure 13B:
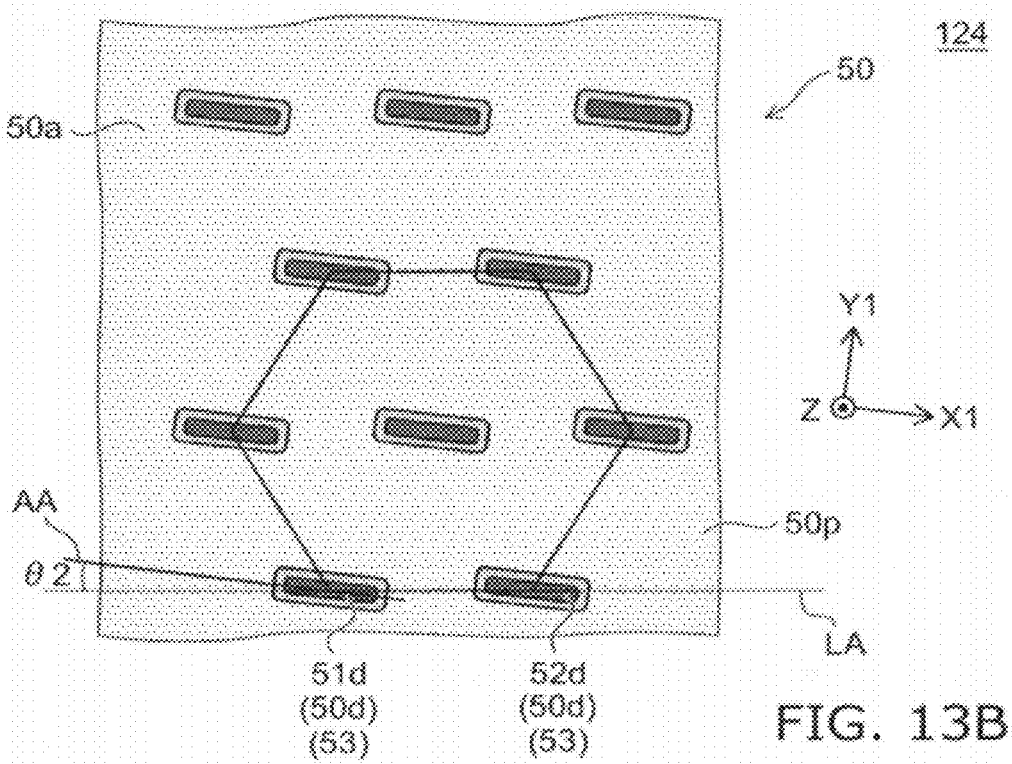

FIG. 13A and FIG. 13B are schematic plan views illustrating the configurations of other nitride semiconductor devices according to the second embodiment.

These drawings schematically illustrate the configurations and the dispositions of the multiple structural bodies 53 in the X-Y plane.

In a nitride semiconductor device 123 according to the embodiment as illustrated in FIG. 13A, the structural body 53 is the protrusion 50p. In a nitride semiconductor device 124 according to the embodiment as illustrated in FIG. 13B, the structural body 53 is the recess 50d. The planar configurations of the protrusion 50p and the recess 50d are rectangles. In such a case as well, the planar configurations of the multiple structural bodies 53 are anisotropic along two mutually perpendicular axes parallel to the major surface 50a.

The absolute value of the angle θ2 between the anisotropic axis direction AA and the lattice axis direction LA is not less than 1 degree and not more than 10 degrees.

In the nitride semiconductor devices 121 to 124 recited above, the nearest direction of the arrangement of the multiple structural bodies 53 (the structural body axis direction SA) is provided along the lattice axis direction LA. The embodiment is not limited thereto. The absolute value of the angle θ2 between the anisotropic axis direction AA and the lattice axis direction LA may be set to be not less than 1 degree and not more than 10 degrees; and the absolute value of the angle θ1 between the structural body axis direction SA and the lattice axis direction LA may be set to be not less than 1 degree and not more than 10 degrees.

Third Embodiment

The embodiment relates to a nitride semiconductor layer growth substrate used to grow a nitride semiconductor layer. The nitride semiconductor layer growth substrate according to the embodiment includes the substrate 50 described in regard to the first embodiment. The nitride semiconductor layer growth substrate has the major surface 50a used to grow a nitride semiconductor layer (e.g., the semiconductor functional layer 90 recited above). The nitride semiconductor layer growth substrate includes, for example, the multiple structural bodies 53 disposed two-dimensionally in the major surface 50a. The nitride semiconductor layer growth substrate is a single crystal.

The nitride semiconductor layer growth substrate may include, for example, a monocrystalline substrate of sapphire. The nitride semiconductor layer growth substrate may include, for example, GaN, SiC, and the like. Thus, the nitride semiconductor layer growth substrate may have a crystal structure of the hexagonal crystal system.

Each of the multiple structural bodies 53 is the protrusion 50p provided on the major surface 50a or the recess 50d provided on the major surface 50a. The absolute value of the angle θ1 between the nearest direction of the arrangement of the multiple structural bodies 53 (the structural body axis direction SA) and the nearest direction of the crystal lattice 50c of the nitride semiconductor layer growth substrate in the plane parallel to the major surface 50a (the lattice axis direction LA) is not less than 1 degree and not more than 10 degrees.

According to the nitride semiconductor layer growth substrate according to the embodiment, for example, the edge dislocation density of the GaN of the nitride semiconductor layer grown on the nitride semiconductor layer growth substrate can be reduced. Thereby, a nitride semiconductor layer growth substrate can be provided to form a nitride semiconductor device having a high efficiency.

In such a case as well, the nearest direction of the nitride semiconductor layer growth substrate in the plane parallel to the major surface 50a (the lattice axis direction LA) may be parallel to an m-plane of the crystal structure of the nitride semiconductor layer growth substrate.

Fourth Embodiment

The embodiment relates to a nitride semiconductor layer growth substrate used to grow a nitride semiconductor layer.

The nitride semiconductor layer growth substrate according to the embodiment includes the substrate 50 described in regard to the second embodiment.

The nitride semiconductor layer growth substrate includes the multiple structural bodies 53. Each of the multiple structural bodies 53 is the protrusion 50p provided on the major surface 50a or the recess 50d provided on the major surface 50a. The planar configuration of each of the multiple structural bodies 53 cut by a plane parallel to the major surface 50a is anisotropic along two mutually perpendicular axes parallel to the major surface 50a. The absolute value of the angle θ2 between the anisotropic axis direction AA and the nearest direction of the crystal lattice 50c of the nitride semiconductor layer growth substrate in the plane parallel to the major surface 50a (the lattice axis direction LA) is not less than 1 degree and not more than 10 degrees.

According to the nitride semiconductor layer growth substrate according to the embodiment, for example, the edge dislocation density of the GaN of the nitride semiconductor layer grown on the nitride semiconductor layer growth substrate can be reduced. Thereby, a nitride semiconductor layer growth substrate can be provided to form a nitride semiconductor device having a high efficiency.

In the nitride semiconductor layer growth substrate according to the third and fourth embodiments as well, it is desirable for at least one selected from the length (e.g., the height of the protrusion 50p or the depth of the recess 50d), the width, and the pitch of the multiple structural bodies 53 along an axis perpendicular to the major surface 50a to be longer than the wavelength of the light emitted from the light emitting layer 30. Thereby, the improvement effect of the light extraction efficiency increases.

The nitride semiconductor layer growth substrate according to the third and fourth embodiments may have a crystal structure of the hexagonal crystal system. In such a case, the lattice axis direction LA (the nearest direction of the crystal lattice 50c of the nitride semiconductor layer growth substrate in the plane parallel to the major surface 50a) is parallel to an m-plane (one of the multiple m-planes) of the crystal structure.

According to the embodiments, a nitride semiconductor layer growth substrate and a nitride semiconductor device having a high efficiency can be provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nitride semiconductor devices such as substrates, semiconductor functional layers, semiconductor layers, light emitting layers, foundation layers, buffer layers, electrodes, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all nitride semiconductor devices and nitride semiconductor layer growth substrates practicable by an appropriate design modification by one skilled in the art based on the nitride semiconductor devices and the nitride semiconductor layer growth substrates described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device, comprising: a substrate of a single crystal, the substrate having a major surface and including a plurality of structural bodies disposed in the major surface, each of the plurality of structural bodies being a protrusion provided on the major surface or a recess provided on the major surface, an absolute value of an angle between a nearest direction of an arrangement of the plurality of structural bodies and a direction of an axis connecting two lattice points of a crystal lattice of the substrate, the two lattice points being nearest each other in a plane parallel to the major surface, being not less than 1 degree and not more than 10 degrees; and a semiconductor functional layer provided on the major surface and including a nitride semiconductor.

2. The device according to claim 1, wherein the substrate has a crystal structure of a hexagonal crystal system, and the direction of said axis is parallel to an m-plane of the crystal structure.

3. The device according to claim 1, wherein the semiconductor functional layer includes:
a first semiconductor layer of a first conductivity type provided on the major surface, the first semiconductor layer including a nitride semiconductor;
a light emitting layer provided on the first semiconductor layer and including a nitride semiconductor; and
a second semiconductor layer of a second conductivity type provided on the light emitting layer, the second conductivity type being different from the first conductivity type, the second semiconductor layer including a nitride semiconductor.

4. The device according to claim 3, wherein the first conductivity type is an n-type, and the second conductivity type is a p-type.

5. The device according to claim 3, wherein at least one of a height of the protrusion, a width of the protrusion and a pitch of the protrusion is longer than a wavelength of a light emitted from the light emitting layer.

6. The device according to claim 3, wherein at least one of a height of the recess, a width of the recess and a pitch of the recess is longer than a wavelength of a light emitted from the light emitting layer.

7. The device according to claim 3, further comprising: a buffer layer provided between the first semiconductor layer and the substrate, the buffer layer including GaN.

8. The device according to claim 1, wherein the substrate is one of sapphire, GaN and SiC.

9. A nitride semiconductor device, comprising:
a substrate of a single crystal; and
a semiconductor functional layer provided on a major surface of the substrate and including a nitride semiconductor,
the substrate including a plurality of structural bodies disposed in the major surface,
each of the plurality of structural bodies being a protrusion provided on the major surface or a recess provided on the major surface,
a planar configuration of each of the plurality of structural bodies cut by a plane parallel to the major surface having anisotropy along two mutually perpendicular axes parallel to the major surface, and
an absolute value of an angle between an axis direction of the anisotropy and a direction of an axis connecting two lattice points of a crystal lattice of the substrate, the two lattice points being nearest each other in the plane parallel to the major surface, being not less than 1 degree and not more than 10 degrees.

10. The device according to claim 9, wherein the substrate has a crystal structure of a hexagonal crystal system, and the direction of said axis is parallel to an m-plane of the crystal structure.

11. The device according to claim 9, wherein the semiconductor functional layer includes:
a first semiconductor layer of a first conductivity type provided on the major surface, the first semiconductor layer including a nitride semiconductor;
a light emitting layer provided on the first semiconductor layer and including a nitride semiconductor; and
a second semiconductor layer of a second conductivity type provided on the light emitting layer, the second conductivity type being different from the first conductivity type, the second semiconductor layer including a nitride semiconductor.

12. The device according to claim 11, wherein the first conductivity type is an n-type, and the second conductivity type is a p-type.

13. The device according to claim 11, wherein at least one of a height of the protrusion, a width of the protrusion and a pitch of the protrusion is longer than a wavelength of a light emitted from the light emitting layer.

14. The device according to claim 11, wherein at least one of a height of the recess, a width of the recess and a pitch of the recess is longer than a wavelength of a light emitted from the light emitting layer.

15. The device according to claim 11, further comprising: a buffer layer provided between the first semiconductor layer and the substrate, the buffer layer including GaN.

16. The device according to claim 9, wherein the substrate is one of sapphire, GaN and SiC.

17. A nitride semiconductor layer growth substrate comprising: a plurality of structural bodies disposed in a major surface used to grow a nitride semiconductor layer, the substrate being a single crystal,
each of the plurality of structural bodies being a protrusion provided on the major surface or a recess provided on the major surface, and
an absolute value of an angle between a nearest direction of an arrangement of the plurality of structural bodies and a direction of an axis connecting two lattice points of a crystal lattice of the nitride semiconductor layer growth substrate, the two lattice points being nearest each other in the plane parallel to the major surface, being not less than 1 degree and not more than 10 degrees.

18. The substrate according to claim 17, wherein the nitride semiconductor layer growth substrate has a crystal structure of a hexagonal crystal system, and the direction of said axis is parallel to an m-plane of the crystal structure.

19. A nitride semiconductor layer growth substrate comprising: a plurality of structural bodies disposed in a major surface used to grow a nitride semiconductor layer, the substrate being a single crystal,
each of the plurality of structural bodies being a protrusion provided on the major surface or a recess provided on the major surface,
a planar configuration of each of the plurality of structural bodies cut by a plane parallel to the major surface having anisotropy along two mutually perpendicular axes parallel to the major surface, and
an absolute value of an angle between an axis direction of the anisotropy and a direction of an axis connecting two lattice points of a crystal lattice of the nitride semiconductor layer growth substrate, the two lattice points being nearest each other in the plane parallel to the major surface, being not less than 1 degree and not more than 10 degrees.

20. The substrate according to claim 19, wherein the nitride semiconductor layer growth substrate has a crystal structure of a hexagonal crystal system, and the direction of said axis is parallel to an m-plane of the crystal structure.

* * * * *